(12) United States Patent
Ishii

(10) Patent No.: US 8,077,901 B2
(45) Date of Patent: Dec. 13, 2011

(54) APPARATUS WITH A BUILT-IN LOUD SPEAKER AND LCD TELEVISION RECEIVER

(75) Inventor: Hiroki Ishii, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 875 days.

(21) Appl. No.: 12/153,565

(22) Filed: May 21, 2008

(65) Prior Publication Data

US 2008/0292128 A1    Nov. 27, 2008

(30) Foreign Application Priority Data

May 23, 2007   (JP) ................................. 2007-136360

(51) Int. Cl.
 *H04R 1/02* (2006.01)
(52) U.S. Cl. ........................................ 381/388; 381/386
(58) Field of Classification Search .................. 381/386, 381/388
See application file for complete search history.

(56) References Cited

U.S. PATENT DOCUMENTS

| | | | |
|---|---|---|---|
| 2,550,336 A | 4/1951 | Daniel | 181/31 |
| 6,944,024 B1 | 9/2005 | Devine, III | 361/704 |
| 7,259,964 B2 * | 8/2007 | Yamamura et al. | 361/697 |
| 7,907,742 B2 * | 3/2011 | Nakajima et al. | 381/152 |

FOREIGN PATENT DOCUMENTS

| | | |
|---|---|---|
| CN | 2290159 Y | 9/1998 |
| DE | 1 024 593 | 1/1955 |
| EP | 1 528 836 A2 | 5/2005 |
| EP | 1 581 025 A2 | 9/2005 |
| JP | 57-113589 | 7/1982 |
| JP | 3-75691 U | 7/1991 |
| JP | 5-28196 | 4/1993 |
| JP | 06-233367 | 8/1994 |
| JP | 2004-120424 | 4/2004 |
| JP | 2006-203666 | 8/2006 |
| WO | WO 2006/104101 A1 | 10/2006 |

* cited by examiner

*Primary Examiner* — Roy Potter

(74) *Attorney, Agent, or Firm* — Morgan, Lewis & Bockius LLP

(57) ABSTRACT

A duct that includes a pair of rib walls which are formed unitarily with a rear cabinet in such a manner that the rib walls face with other in the up and down direction. The duct serves as an air flow passage that extends from a rear-open portion of a speaker box and through which air flow produced by vibration of a speaker body passes. A heat radiating portion of a heat sink is disposed in the duct.

3 Claims, 3 Drawing Sheets

APPARATUS WITH A BUILT-IN LOUD SPEAKER AND LCD TELEVISION RECEIVER

This application is based on Japanese Patent Application No. 2007-136360 filed on May 23, 2007, the contents of which are hereby incorporated by reference.

BACKGROUND OF THE INVENTION

1. Field of the Invention

The present invention relates to an apparatus, for example, an LCD television receiver, which has a built-in loudspeaker and uses air flow produced by vibration of the speaker body to expedite heat radiation from a heat sink.

2. Description of Related Art

Conventionally, in an apparatus that has a built-in loud speaker, it is known that air flow produced by vibration of the speaker body is used to expedite heat radiation from a heat sink.

For example, in JP-A-2006-203666, opposite surfaces of a speaker box are equipped with an air inlet check valve and an air exhaust check valve, respectively. Air flow is produced by opening and closing the check valves with the aid of pressure difference, which is caused by vibration of the speaker body, between the inside and outside of the speaker box, and heat radiated from a heat sink arranged near the air inlet check valve is radiated to the outside of the housing through the speaker box (paragraphs [0030]-[0034], FIG. 2, FIG. 3).

In JP-U-H3-75691, air flow that is taken in and exhausted through openings of a speaker box by vibration of the speaker body is guided to a heat sink arranged near the speaker box, which enhances the heat radiation efficiency from the heat sink (page 2, line 18-page 3, line 1).

However, in the method disclosed in JP-A-2006-203666 mentioned above, because the air heated by radiated heat from the heat sink passes through the inside of the speaker box, a problem that the speaker body is thermally deformed can occur.

In the method disclosed in JP-U-H3-75691 mentioned above, the air flow guided to the heat sink is not ensured to be exhausted to the outside of the housing. Accordingly, the air stays inside the housing and the housing is unexpectedly filled with heat.

SUMMARY OF THE INVENTION

The present invention has been made to cope with the conventional problems, and it is an object of the present invention to provide an apparatus or an LCD television receiver with a built-in loud speaker that enhances heat radiation efficiency from a heat sink by forming an air flow passage inside the housing which surely guides air flow, which is produced by vibration of a speaker body, to the outside of the housing.

To achieve the object, an apparatus with a built-in loud speaker according to the present invention has a rear-open speaker box arranged inside a housing, a speaker body arranged inside the speaker box, a heat sink that absorbs heat radiated from the apparatus and radiates the heat, and uses air flow produced by vibration of the speaker body to expedite heat radiation from the heat sink, the apparatus comprises an opening portion provided on the rear wall of the housing, a duct extending from an rear open portion to the opening portion, wherein a heat radiation portion of the heat sink is installed inside the duct.

According to this structure, because the duct (air flow passage) that extends from the rear-open portion of the speaker box to the opening portion provided on the rear surface of the housing is formed, air flow produced by vibration of the speaker body passes through the duct and is exhausted via the opening portion to the outside of the housing. Accordingly, heat radiated from the heat sink disposed in the duct is exhausted to the outside of the housing together with the air flow, and the heat radiation efficiency is increased.

Besides, in the apparatus with a built-in loud speaker according to the present invention, the speaker box comprises an enclosure-shaped rib wall unitarily formed with the housing.

According to this structure, the number of parts is reduced, and the speaker box is formed unitarily with the housing at low cost.

In addition, in the apparatus with a built-in loud speaker according to the present invention, the duct comprises a pair of rib walls that are formed unitarily with the housing in such a manner that they face each other in the up and down direction.

According to this structure, the number of parts is reduced, and the duct is formed unitarily with the housing at low cost.

An LCD television receiver according to the present invention has an LCD module equipped with an LCD panel, a board which is disposed behind the LCD module and on which heat radiating parts such as IC parts are mounted, a front cabinet that faces the display surface of the LCD panel, a rear cabinet that is connected to the front cabinet to form a housing, a speaker box that comprises an enclosure-shaped rib wall unitarily formed with the front cabinet, a speaker body disposed in the speaker box, a heat sink that absorbs and exhausts heat radiated from the heat radiating parts on the board, and uses air flow produced by vibration of a speaker body to expedite heat radiation from a heat sink, the LCD television receiver comprises an opening portion formed on the rear wall of the rear cabinet, and a duct which includes a pair of rib walls that are formed unitarily with the rear cabinet facing with each other in the up and down direction and extends from a rear-open portion of the speaker box to the opening portion, wherein a heat radiating portion of the heat sink is disposed in the duct.

According to this structure, because the duct (air flow passage) that extends from the rear-open portion of the speaker box to the opening portion provide on the rear wall of the rear cabinet is formed, air flow produced by vibration of the speaker body passes through the duct and is exhausted via the opening portion to the outside of the housing. Therefore, the heat radiated from the heat radiating portion of the heat sink disposed in the duct is exhausted to the outside of the housing together with the air flow, and the heat radiating efficiency is increased.

DETAILED DESCRIPTION OF PREFERRED EMBODIMENTS

Figure 1:
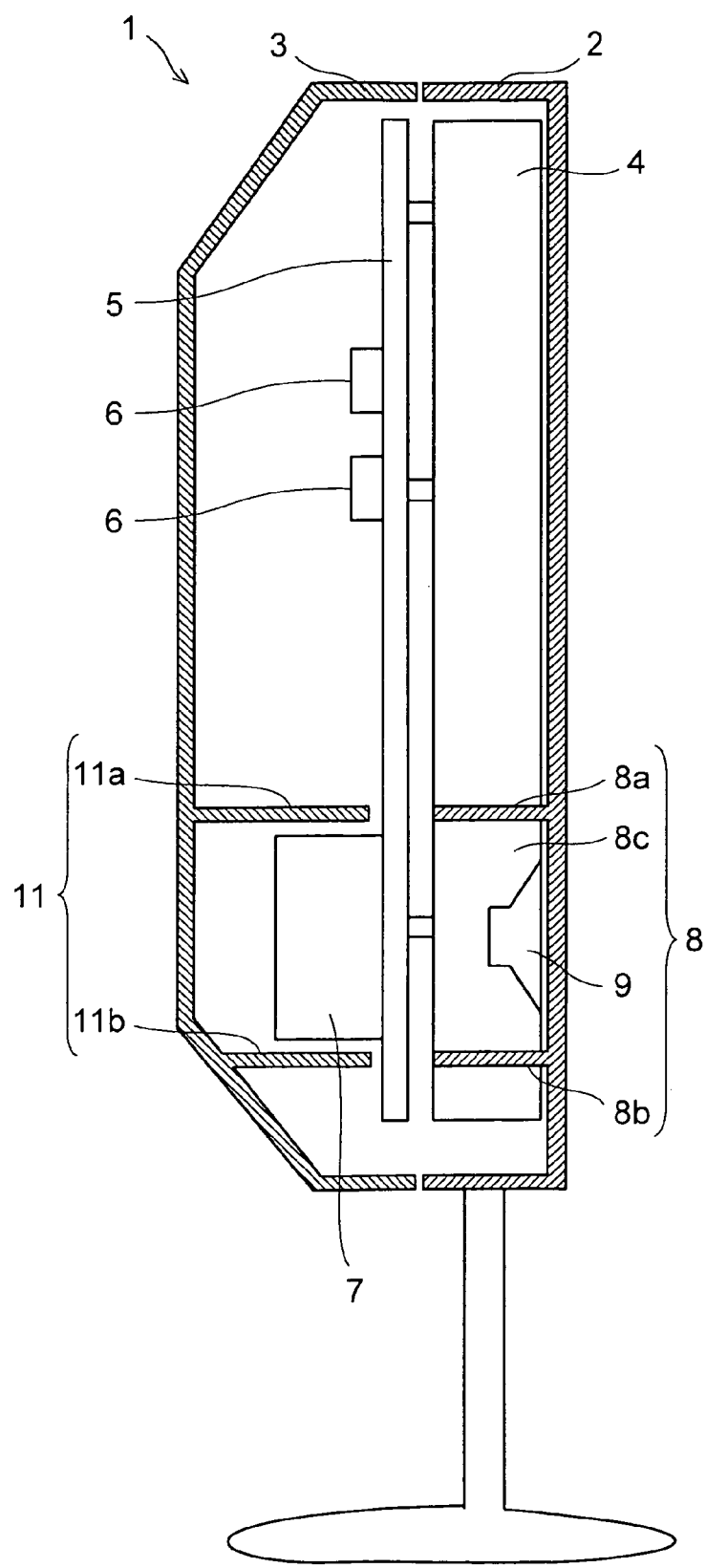
FIG. 1 is a side sectional view of an LCD television receiver according to an embodiment of the present invention.
Figure 2:
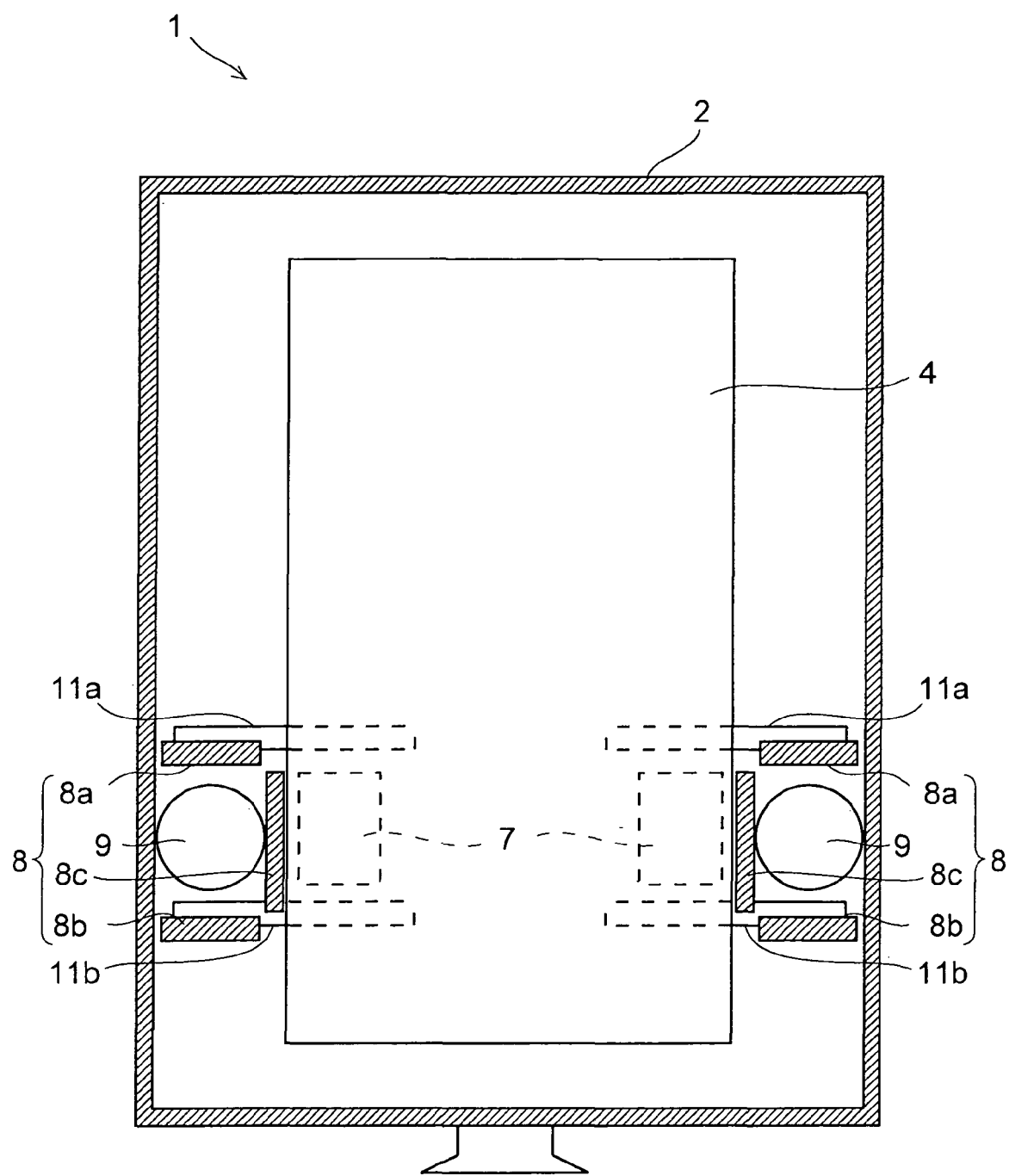
FIG. 2 is a front sectional view of the LCD television receiver according to the embodiment of the present invention.

Hereinafter, an LCD television receiver as an apparatus with a built-in loud speaker according to the present invention will be described as the best mode of the present invention referring to the drawings. FIG. 1 is a side sectional view of an LCD television receiver according to an embodiment of the present invention, and FIG. 2 is a front sectional view on the LCD television receiver, and FIG. 3 is a top sectional view of the LCD television receiver.

As shown in FIG. 1, the housing of the LCD television receiver 1 comprises a rear-open box-shaped front cabinet 2 that faces a display surface of an LCD panel (not shown), and a front-open box-shaped rear cabinet 3 that is connected to a rear-open portion of the front cabinet 2.

Figure 3:
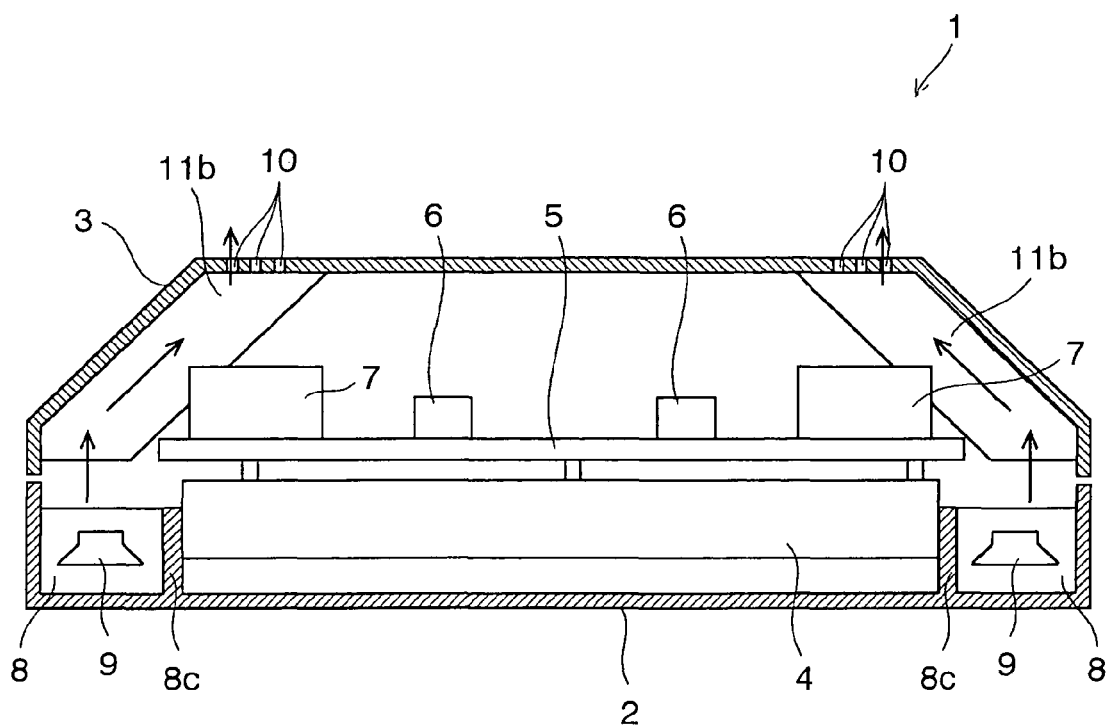
FIG. 3 is a top sectional view of the LCD television receiver according to the embodiment of the present invention.

As shown in FIG. 3, an LCD module 4 equipped with an LCD panel is fixed at the central portion in the width direction of the inner surface of the front wall of the front cabinet 2, and a board 5 on which heat radiating parts 6 such as IC parts are mounted is fixed with screws behind the LCD module 4. Also, a heat sink that absorbs and radiates heat from the heat radiating parts is mounted on the board 5.

As shown in FIG. 3, rear-open speaker boxes 8 each of which comprises enclosure-shaped rib walls 8a, 8b, and 8c are respectively formed unitarily with the front cabinet 2 near the LCD module 4 at both left and right sides in the width direction of the inner surface of the front wall of the front cabinet 2. Speaker bodies 9 including speaker cones are respectively disposed in each of the speaker boxes 8.

As shown in FIG. 3, opening portions 10 each of which includes a plurality of small round openings are respectively formed at both left and right sides in the width direction of the rear wall of the rear cabinet 3. The opening portions 10 function as ventilation openings for heat radiation.

As shown in FIGS. 1 and 2, ducts 11 each of which includes a pair of rib walls 11a, 11b formed with the rib walls facing with each other in the up and down direction are formed in such a manner that they respectively extend from the inner surfaces of the left and right side walls of the rear cabinet 3. Each duct 11 functions as an air flow passage that leads from the rear open portion of the speaker box 8 to the opening portions 10 and through which air flow produced by vibration of the speaker body 9 passes. The heat radiating portions of the heat sinks 7 are arranged in such a manner that they are located between the upper and lower rib walls 11a and 11b, that is, in the ducts 11.

When the ducts 11 are formed with the upper and lower rib walls 11a and 11b, ducts 11 do not have a pipe shape because there are no walls at the tip ends of the rib walls 11a and 11b. However, the rib walls 11a, 11 are high enough to work as an air flow passage.

In the above-described structure of the LCD television receiver, when a user watches a television program or the like, images are displayed on the LCD panel, and at the same time, sound is released from the speaker body 9. At this time, the speaker bodies 9 vibrates, and the air flow produced by the vibration passes between the rib walls 11a and 11b, that is, through the ducts 11 and is exhausted via the openings 10 to the outside of the housing. Accordingly, because the heat radiated from the heat radiating portions of the heat sinks 7 is exhausted to the outside of the housing together with the air flow, the heat radiating efficiency is increased.

In the above embodiment, the speaker boxes 8 and ducts 11 are formed unitarily with the front cabinet 2 and the rear cabinet 3, respectively. However, they may be formed as separate members. In such a case, ducts 11 may be formed into a pipe shape, openings may be provided through side walls of the ducts 11, and the heat radiating portions of the heat sinks 7 may be disposed in such a manner that they penetrate the side walls through the openings and are located inside the ducts 11.

What is claimed is:

1. An apparatus with a built-in loud speaker, including:
    a rear-open speaker box that is disposed in a housing and includes an enclosure-shaped rib wall which is unitarily formed with the housing;
    a speaker body disposed in the speaker box; and
    a heat sink for absorbing and radiating heat radiated from the apparatus;
    the apparatus using air flow produced by vibration of a speaker body to expedite heat radiation from a heat sink, the apparatus comprising:
    an opening formed through a rear wall of the housing; and
    a duct that extends from a rear-open portion of the speaker box to the opening;
    wherein a heat radiating portion of the heat sink is disposed in the duct.

2. The apparatus with a built-in loud speaker according to claim 1, wherein the duct includes a pair of rib walls that are unitarily formed with the housing such that the rib walls face with each other in the up and down direction.

3. An LCD television receiver including:
    an LCD module equipped with an LCD panel;
    a board which is disposed behind the LCD module and on which heat radiating parts such as IC parts are mounted;
    a front cabinet that faces the display surface of the LCD panel;
    a rear cabinet that is connected to the front cabinet to form a housing;
    a speaker box that includes an enclosure-shaped rib wall unitarily formed with the front cabinet;
    a speaker body disposed in the speaker box; and
    a heat sink that absorbs and exhausts heat radiated from a heat radiating part on the board;
    the apparatus using air flow produced by vibration of a speaker body to expedite heat radiation from a heat sink, the LCD television receiver comprising:
    an opening portion formed on the rear wall of the rear cabinet; and
    a duct which includes a pair of rib walls that are formed unitarily with the rear cabinet in such a manner that the rib walls face with each other in the up and down direction and which extends from a rear open portion of the speaker box to the opening portion,
    wherein a heat radiating portion of the heat sink is disposed in the duct.

* * * * *